United States Patent
Golz et al.

(10) Patent No.: US 6,472,274 B1
(45) Date of Patent: Oct. 29, 2002

(54) MOSFET WITH SELF-ALIGNED CHANNEL EDGE IMPLANT AND METHOD

(75) Inventors: John Walter Golz, Cold Spring, NY (US); Fumihiko Satoh, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 09/606,570

(22) Filed: Jun. 29, 2000

(51) Int. Cl.⁷ .............................................. H01L 21/336
(52) U.S. Cl. ....................... 438/270; 257/510; 438/296; 438/391
(58) Field of Search .......................... 257/510; 438/221, 438/296, 700, 242, 246, 248, 259, 391, 561, 270

(56) References Cited

U.S. PATENT DOCUMENTS

| | | | |
|---|---|---|---|
| 4,677,736 A | * | 7/1987 | Brown .......................... 438/296 |
| 5,291,049 A | * | 3/1994 | Morita .......................... 257/335 |
| 5,643,822 A | | 7/1997 | Furukawa et al. |
| 5,741,738 A | | 4/1998 | Mandelman et al. |
| 5,798,553 A | | 8/1998 | Furukawa et al. |
| 5,923,067 A | * | 7/1999 | Voldman ....................... 257/349 |
| 5,930,620 A | * | 7/1999 | Wristers et al. ............... 438/243 |
| 5,977,602 A | * | 11/1999 | Gardner et al. ............... 257/336 |
| 5,994,202 A | | 11/1999 | Gambino et al. |
| 6,046,115 A | * | 4/2000 | Molloy et al. ................. 134/1.2 |
| 6,054,344 A | * | 4/2000 | Liang et al. ................... 438/218 |
| 6,110,787 A | * | 8/2000 | Chan et al. .................... 438/299 |
| 6,194,748 B1 | * | 2/2001 | Yu ................................. 257/216 |
| 6,204,137 B1 | * | 3/2001 | Teo et al. ....................... 438/296 |
| 6,242,788 B1 | * | 6/2001 | Mizuo ............................ 257/506 |
| 6,262,456 B1 | * | 7/2001 | Yu et al. ......................... 257/370 |
| 6,268,630 B1 | * | 7/2001 | Schwank et al. .............. 257/347 |
| 6,274,420 B1 | * | 8/2001 | Xiang et al. ................... 438/221 |
| 6,277,736 B1 | * | 8/2001 | Chen et al. .................... 438/303 |
| 6,278,164 B1 | * | 8/2001 | Hieda et al. ................... 257/295 |

FOREIGN PATENT DOCUMENTS

| | | | | |
|---|---|---|---|---|
| JP | 06151896 A | * | 5/1994 | ........... H01L/29/90 |

\* cited by examiner

*Primary Examiner*—Olik Chaudhuri
*Assistant Examiner*—Nathan W. Ha
(74) *Attorney, Agent, or Firm*—Scully, Scott, Murphy, & Presser; Daryl K. Neff

(57) ABSTRACT

A MOSFET device and method, the method involves forming the MOSFET device by selectively doping bordering channel regions in the device such that, in operation, the threshold, or turn-on, voltage is equalized across the channel. The device structure comprises a self-aligned channel edge implant region for equalizing threshold voltages in the channel edge region with threshold voltages in the channel interior region, thereby virtually eliminating sub-threshold leakage current in low voltage applications.

4 Claims, 4 Drawing Sheets

MOSFET WITH SELF-ALIGNED CHANNEL EDGE IMPLANT AND METHOD

BACKGROUND OF THE INVENTION

1. Field of the Invention

This invention relates generally to semiconductor chip devices and manufacturing methods and, particularly, to a metal-oxide-semiconductor-field-effect-transistor (MOSFET)device and method. The method involves forming a MOSFET device by,selectively doping bordering channel regions such that, in operation, the threshold, or turn-on, voltage is equalized across the channel. The device structure comprises a self-aligned channel edge implant region for equalizing threshold voltages in the channel edge region with threshold voltages in the channel interior region, thereby reducing sub-threshold leakage current in low voltage applications.

2. Discussion of the Prior Art

A schematic diagram of a typical MOSFET device is shown in FIG. 1. As shown in FIG. 1, the MOSFET comprises a wafer of silicon (a semiconductor) 1 having two highly doped regions of opposite polarity diffused therein to form a source 2 and a drain 3 region.

Disposed on the semiconductor 1, between the source 2 and the drain 3 regions, is an insulative gate 4 comprising, for example, silicon dioxide (a dielectric). Disposed on top of the gate dielectric is a metal contact 5.

In operation, when a voltage (refered to as a gate voltage) is applied to the gate metal 5 with respect to the drain or source terminal (not shown), a "field effect" is triggered in the semiconductor 1 under the gate and between the source 2 and the drain 3 such that either a build-up or a depletion of charge occurs in the semiconductor 1 under the gate. Whichever event occurs depends on the doping conductivity type of the semiconductor 1 under the gate, and the polarity of the gate voltage. Particularly, the build-up or depletion of charges in the semiconductor 1 creates under the gate 4, a channel 6 that electrically connects the source 2 and drain 3. In this condition, the surface of the semiconductor 1 is said to be inverted, and a current will flow in the channel in response to the-gate voltage, i.e., an increase in the gate voltage will increase the size of the channel and increase the channel current; alternatively, an decrease in the gate voltage will decrease the channel current. By controlling the gate voltage, the device can function as a switch or an amplifier.

In MOSFET devices, for current to flow along the channel, a minimum gate voltage must be applied. This minimum voltage is called the threshold voltage, and it is an important parameter in the operation of the MOSFET device.

Also in MOSFET devices, due to variations in the gate dielectric thickness over the channel, and variations in the charge density and interface charge trapping density across the channel, the threshold at the channel edges is typically lower compared to the threshold voltage at the corresponding inner region of the channel.

A consequence of the lower threshold voltage at the channel edge is that current conduction along the edges will occur at a different, typically lower, gate voltage ($V_G$) than in the inner region. This is depicted schematically in FIG. 3 wherein current conduction at the channel edge ($I_e$) is shown to occur at lower gate voltages than ($I_c$) in the interior of channel.

The edge current, which contributes to what is known as the "off-state leakage" or sub-threshold voltage leakage current", is undesirable particularly for applications that require a low "off-state" leakage current; these applications require a MOSFET which exhibits very low leakage current in its "off-state", for example in low power applications to conserve power, or in DRAM applications to prevent data loss through charge leakage.

The problem of sub-threshold leakage current has been recognized and several prior art solutions have been claimed; see, for example, U.S. Pat. No. 5,994,202A, U.S. Pat. No. 5,643,822 and U.S. Pat. No. 5,798,533. Notwithstanding the prior art, however, the problem persists to varying degrees, hence the need for improvement in this area.

Accordingly, it is desirable to form a MOSFET device structure wherein the sub-threshold leakage current is eliminated or at least minimized. That is, it is desirable to form a MOSFET device structure wherein, application of a gate voltage, the threshold voltage in the channel is such that the threshold edge voltage and the threshold voltage in the interior of the channel are equal or substantially equalized. In other words, it is desirable to form a MOSFET device that exhibits sharp turn-on characteristics.

SUMMARY OF THE INVENTION

In view of the deficiencies in the prior MOSFET devices, it is an object of the present invention to provide a MOSFET device structure having self-aligned channel edge implant region for exhibiting significantly reduced or eliminated sub-threshold leakage current in low voltage applications.

It is also an objective of the invention to provide a method of manufacturing MOSFET device having self-aligned channel edge implant region for exhibiting significantly reduced or eliminated sub-threshold current leakage in low voltage applications.

These and other objectives are accomplished by a MOSFET device and manufacturing method where the device is formed by selectively doping the channel edge region, the method comprising the steps of:

a) depositing a masking layer over a planar surface of a silicon substrate;

b) patterning and etching through said masking layer into said silicon substrate to form first and second trenches defining a MOSFET device active area;

c) selectively etching back said masking material to expose regions of un-etched silicon at border regions of said MOSFET device active area, said border regions defining MOSFET device channel edges;

d) selectively doping said exposed border regions to form drain and source portions each including a respective MOSFET channel edge;

e) filling said trench with an electrically insulating material and removing remaining masking layer;

f) forming a MOSFET gate on and in unetched areas of said MOSFET device active area, wherein a said MOSFET device exhibits reduced or eliminated threshold leakage current in low-voltage applications.

Thus, by the method, a self-aligned mask is formed over the MOSFET device active area including the channel region, laterally etching the mask over the channel region to expose a thin, precisely defined border of underlaying silicon at the edge of the MOSFET device channel, and selectively doping the exposed region. Thereafter, the masking is removed and the MOSFET device is formed in between the exposed channel region. Because the masking process is self-aligned process, the definition of the channel edge and formation of the doping mask can be performed with a single photolithograph step.

The MOSFET device fabricated in accordance with the method of the invention, comprises:

a semiconductor substrate, said substrate comprising a doped source region and a doped drain region, said source and drain regions separated by a channel region and each respectively comprising a doped channel edge region;

a gate disposed on said substrate between said source and drain region substantially covering said channel region, wherein the respective channel edge regions is selectively doped such that when applying a voltage to said gate, a voltage is established in said channel region such that the voltage in said channel edge region is substantially equal to the voltage in a channel interior region.

BRIEF DESCRIPTION OF THE DRAWINGS

Further features, aspects and advantages of the methods of the present invention will become better understood with regard to the following description, appended claims, and accompanying drawings where:

DETAILED DESCRIPTION

The method according to the preferred embodiment of the invention is first described in conjunction with FIGS. 2(a)–(g). Thereafter, the MOSFET device is described in conjunction with FIGS. 2(a)–(g).

Figure 1:
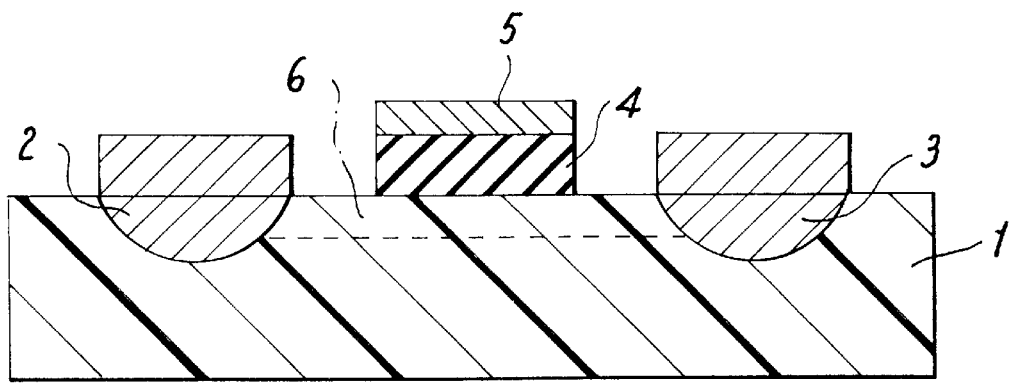
FIG. 1 is a schematic diagram of a prior art MOSFET device.
Figure 2A:
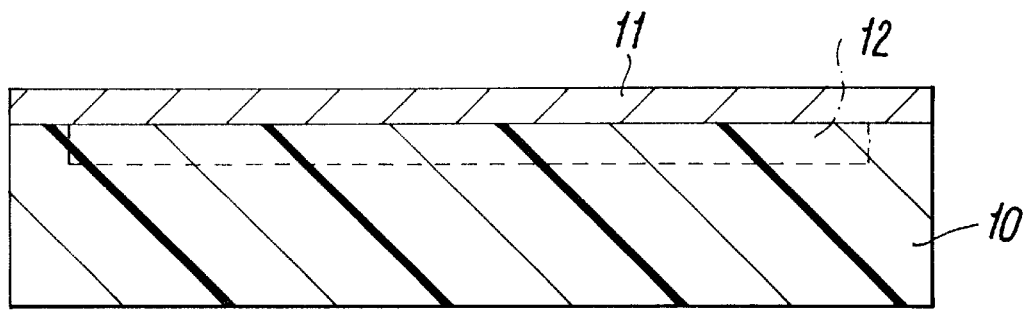
FIGS. 2(a)–(g) are schematic diagrams illustrative of the method of the invention, including the formation of a MOSFET device.

As a first step in the method, and in view of FIG. 2(a), a masking material 11 is deposited over a suitably prepared planar silicon substrate 10, including an active device area 12 for MOSFET device fabrication. The masking material 11 is applied in a convention manner to cover the substrate area 10 where the MOSFET device will fabricated. Suitable masking material include any photoresist well known in the art. Preferably, in this first step, the mask is generated by a self-aligned process such that the definition of the MOSFET device channel edge and the formation of the doping mask can be performed in a single lithography step.

Figure 2B:
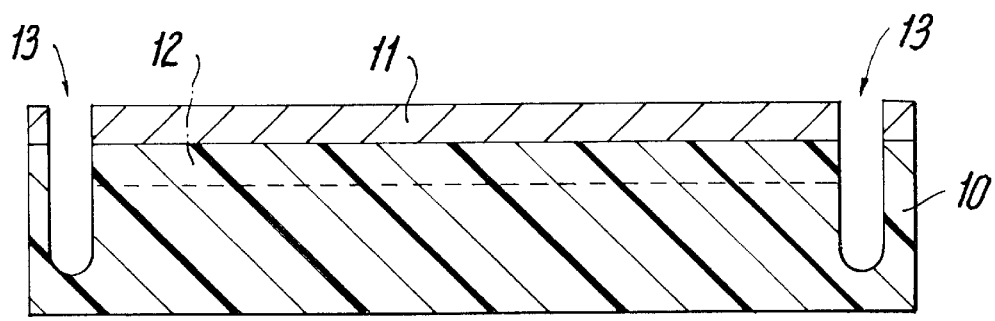

Next, in view of FIG. 2(b), the masking material 11 is patterned and etched through to the silicon substrate 10 to form respective trenches 13 that border the active device area 12. The process of patterning and etching the mask into the silicon is done employing standard etchants and procedures well known in the art. In this step, the top of the active area is protected from etching.

Figure 2C:
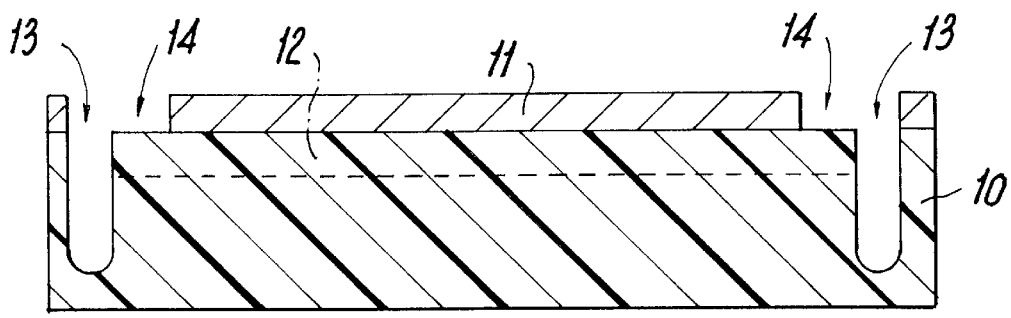

Next, in view of FIG. 2(c), the masking material 11 is selectively removed by a known etch-back technique to reveal border regions 14 defining the MOSFET channel edge comprising un-etched silicon underneath.

Figure 2D:
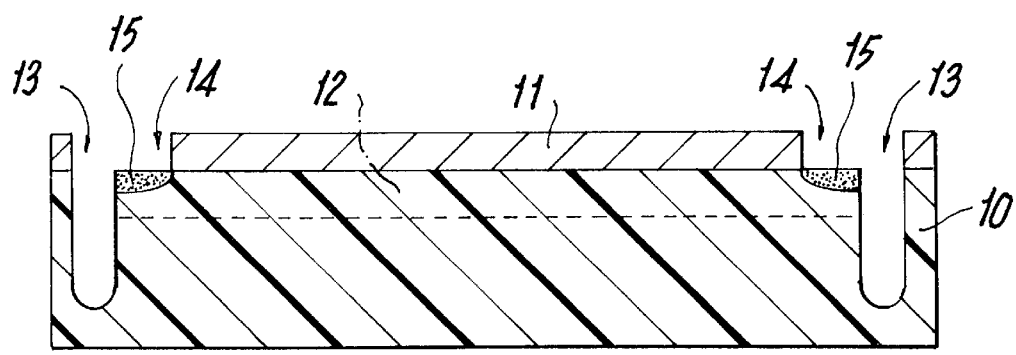

Next, in view of FIG. 2(d), the exposed silicon border regions 14 are exposed using well known techniques such as ion-implantation or diffusion to produce respective doped areas 15 defining the MOSFET device channel edge regions 15. Doping is performed in accordance in accordance with particular device characteristics. A preferred method of doping the exposed silicon is by ion-implantation as this allows for a more precise exposure of the exposed channel edge regions 15 of the silicon.

Figure 2E:
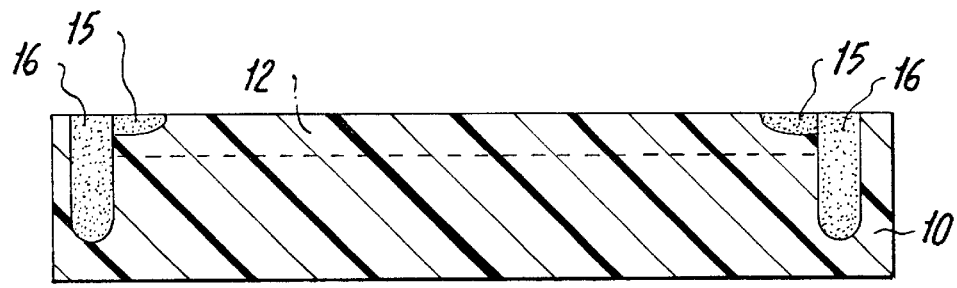

Next, in view of FIG. 2(e), the trench 13 formed by the preceding step described with respect to FIG. 2(b) is filled with an electrically insulation material 16, and the remaining mask material 11 is removed by well known pocesses. Suitable insulating material for filling the trench include silicon nitride and silicon dioxide.

Figure 2F:
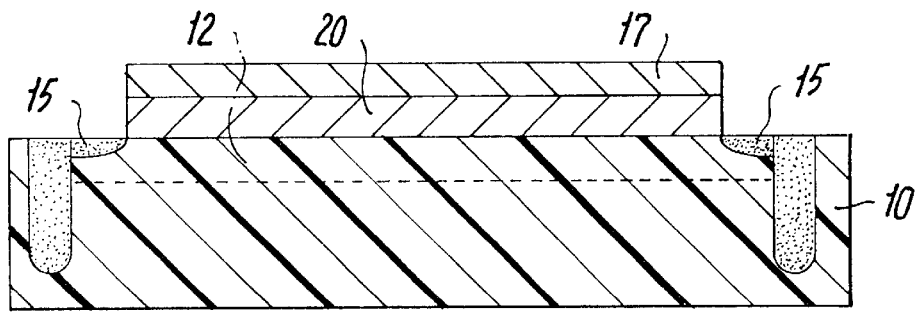
Figure 2G:
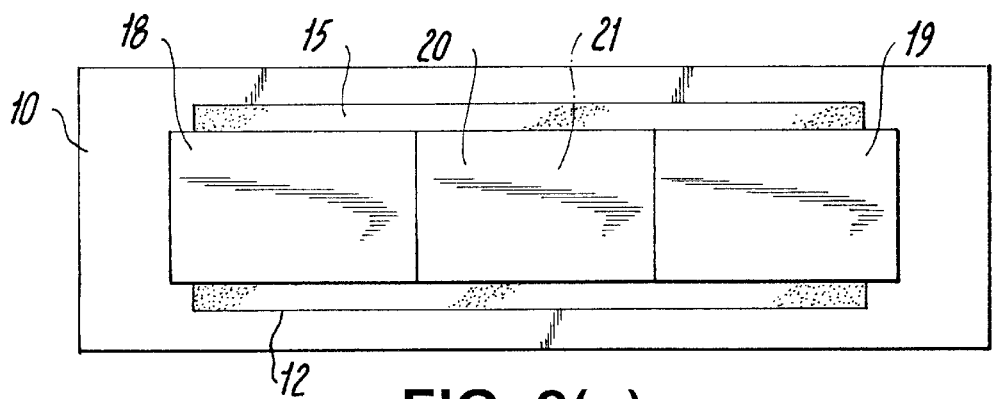

Finally, in view of FIG. 2(f), after removal of the masking layer 11, the MOSFET device 17 comprising a source 18, a drain 19 and a gate with a metal contact 20 are formed on top of the un-etched silicon employing methods well known in the art. A top, plan view of the semiconductor substrate after the removal of the masking material by the present method is shown in FIG. 2(g) wherein the doped region 15, formed at the edge of the channel, is shown disposed beneath the source 18, the drain 19 and the gate 20.

Compared to prior art MOSFET device, the resultant MOSFET device formed by the method described with respect to FIGS. 2(a)–(g) comprises a semiconductor substrate 10 that includes a source region 18 and a drain region 19 therein, and a channel 12 formed between the source 18 and drain 19 within the substrate. Disposed on top of the substrate 10 is a gate 20 formed on the substrate 10 between the source 18 and the drain 19, and disposed substantially over the channel 12, the gate triggering the formation of the channel upon application of a gate voltage. However, due to the formation of the selectively doped channel edge regions 15 in the MOSFET device, the threshold voltage in the channel edge region 15 is equal to or nearly equalized with that of the interior channel region 21, when a gate voltage is applied.

Figure 3:
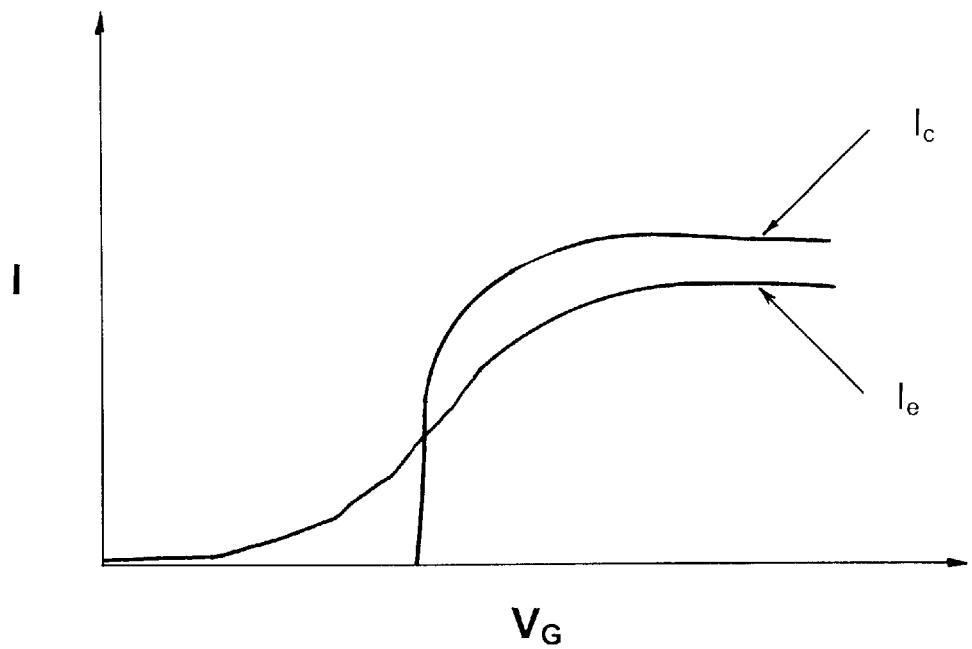
FIG. 3 is a schematic showing the dependence on gate voltage of conduction current at the channel edge ($I_e$) compared to the conduction current ($I_c$) in the channel interior of a prior art MOSFET device.
Figure 4:
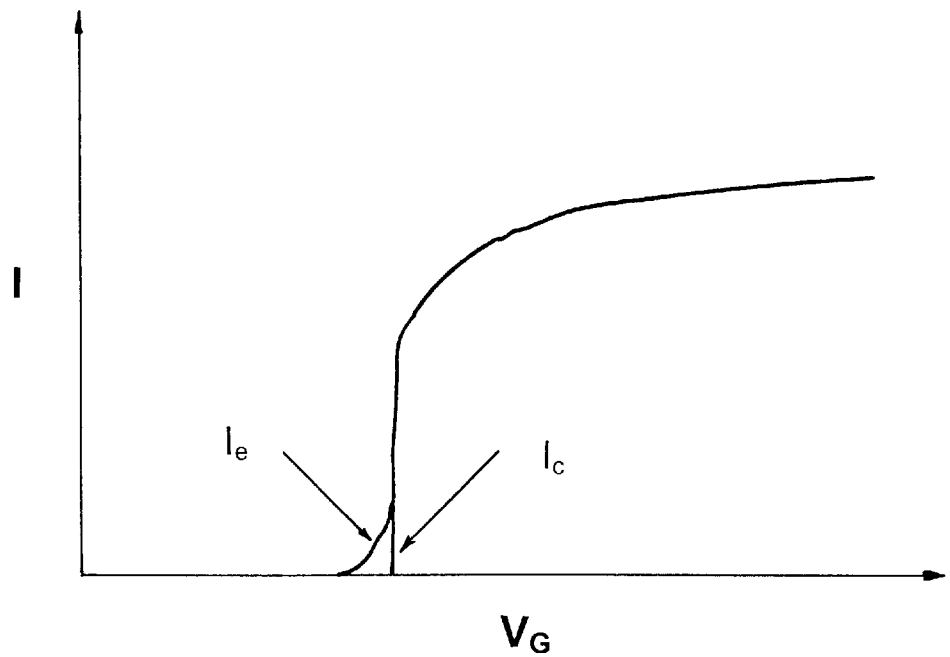
FIG. 4 is a schematic showing the dependence on gate voltage of the conduction current at the channel edge ($I_e$) compared to the conduction current ($I_c$) in the channel interior in the device of the invention.

An example of the improved results achieved by the method steps of FIGS. 2(a)–(g), whereby the channel edge region 15 of a MOSFET device is selectively doped to minimize the difference between the channel edge region threshold voltage and the interior channel region threshold voltage, can be seen in FIG. 4. By contrast with FIG. 3, in FIG. 4, the conduction current in the channel edge ($I_e$) and the conduction current in the channel interior ($I_c$) of the present device are substantially the same, and occur at about the same time.

Since the threshold voltage is substantially equalized across the channel of the MOSFET device, the sub-threshold leakage current along the channel edge caused by variations in the threshold voltage in the channel, is reduced or eliminated. The device can therefore be utilized in low voltage applications that require low "off-state" leakage current, particularly devices having small channel widths and wherein the channel edge region constitutes a significant portion of the entire device.

What is claimed is:

1. A method for forming a MOSFET device, comprising the steps of:
   a) depositing a masking layer over a planar surface of a silicon substrate;
   b) patterning and etching through said masking layer into said silicon substrate to form first and second trenches defining a MOSFET device active area;
   c) selectively etching back said masking material to expose regions of un-etched silicon at border regions of said MOSFET device active area, said border regions defining MOSFET device channel edges;

d) selectively doping said exposed border regions to form drain and source portions each including a respective MOSFET channel edge;

e) filling said trench with an electrically insulating material and removing remaining masking layer;

f) forming a MOSFET gate on and in un-etched areas of said MOSFET device active area, wherein a said MOSFET device exhibits reduced or eliminated threshold leakage current in low-voltage applications.

2. The method of claim 1, wherein said depositing step a) includes implementing a self-aligned masking process.

3. The method of claim 1, wherein said patterning and etching step b) is a lithographic process.

4. The method of claim 1, wherein said selectively doping step d) includes a selective ion implantation technique.

* * * * *